United States Patent [19]

Aoki

[11] 4,359,701
[45] Nov. 16, 1982

[54] CONSTRUCTION OF TUNING CIRCUIT IN TUNER

[75] Inventor: Kazuharu Aoki, Soma, Japan

[73] Assignee: Alps Electric Co., Ltd., Tokyo, Japan

[21] Appl. No.: 212,099

[22] Filed: Dec. 2, 1980

[30] Foreign Application Priority Data

Dec. 31, 1979 [JP] Japan .................. 54/183167[U]

[51] Int. Cl.³ .................................... H03J 3/20
[52] U.S. Cl. ............................. 334/15; 333/235; 334/45; 361/417
[58] Field of Search ............... 334/15, 45; 333/223, 333/235; 331/96, 101, 177 V; 361/414, 417

[56] References Cited

U.S. PATENT DOCUMENTS 3,512,105  5/1970  Lance, Jr. et al. ............. 334/15 X
3,651,409  3/1972  George et al. ................. 334/15 X

FOREIGN PATENT DOCUMENTS 53-157859  12/1978  Japan .
54-97780    8/1979  Japan .

Primary Examiner—Paul L. Gensler
Attorney, Agent, or Firm—Guy W. Shoup; Gerard F. Dunne

[57] ABSTRACT

A printed circuit board lamination consisting of upper and lower printed circuit boards is provided with an area consisting of the sole lower printed circuit board, and a varactor diode and a resonance rod portion parallel to the lamination are arranged in this area. Thus, the length of lead of the varactor diode is reduced in effect, and also the effects of variation of the dielectric constant of the printed circuit board due to changes of the temperature thereof and relative humidity are reduced.

4 Claims, 6 Drawing Figures

CONSTRUCTION OF TUNING CIRCUIT IN TUNER

BACKGROUND OF THE INVENTION

The present invention relates to a construction of electronic tuning type tuners for television or the like and, more particularly, to a construction suitable for a tuning circuit including a resonance rod.

An electronic tuning type tuner, for instance UHF electronic tuning type tuner, has a construction having a plurality of cavities defined by shield plates, with electronic component parts such as transistors, resistors, capacitors and resonance rods being disposed in these cavities. In tuners recently proposed, there is a trend toward using two printed circuit boards overlapped back to back. FIGS. 1 and 2 show such a tuner construction. As is shown, a cavity is defined in a chassis 1 by shield plates 2, and in this cavity, electronic component parts such as resonance rod 3, a varactor diode 4, an end capacitor 5 and a resistor 6 are provided to form a tuning circuit. The resonance rod 3, resistor 6 and other electronic parts are soldered to a printed circuit board lamination 7 including two printed circuit boards laminated back to back. The printed circuit board lamination consists of upper and lower printed circuits boards 7a and 7b which are adhered together by adhesive 8. A printed pattern 7c is provided on board 7a for supplying a tuning voltage to the varactor diode 4, a pattern 7d is provided on board 7b for connecting the resistor 6 and resonance rod 3, and a pattern 7e is provided on board 7b for grounding.

With such construction of the resonance rod circuit, a lead 4a of the varactor diode 4 is considerably long since it must extend through the two printed circuit boards 7a and 7b. Therefore, the residual inductance is high, so that the frequency range is narrow. If the capacitance of the end capacitor 5 is increased to overcome this drawback, the circuit Q is reduced. In addition, the dielectric constant of the printed circuit board 7a is changed with changes of the temperature and relative humidity, so that the resonant frequency of the circuit is subject to fluctuations.

SUMMARY OF THE INVENTION

An object of the present invention is to provide a construction of the tuning circuit for a tuner, with which the resonant frequency of the tuning circuit is not easily affected by changes of the dielectric constant of the printed circuit board.

Another object of the present invention is to provide a construction of the tuning circuit of tuner, which permits the reduction of the floating inductance accompanying the tuning circuit.

A further object of the present invention is to provide a construction of the tuning circuit, suitable for a small-sized electronic tuner.

According to the invention, the printed circuit board lamination of two printed circuit boards laminated back to back is provided with an area consisting of a single printed circuit board, and a varactor diode and a resonance rod portion parallel to the lamination are arranged on this area.

The above and other objects, features and advantages of the present invention will become more apparent from the following description when taken in conjunction with the accompanying drawings which show preferred embodiments by way of illustrative example.

PREFERRED EMBODIMENTS OF THE INVENTION

Figure 1:
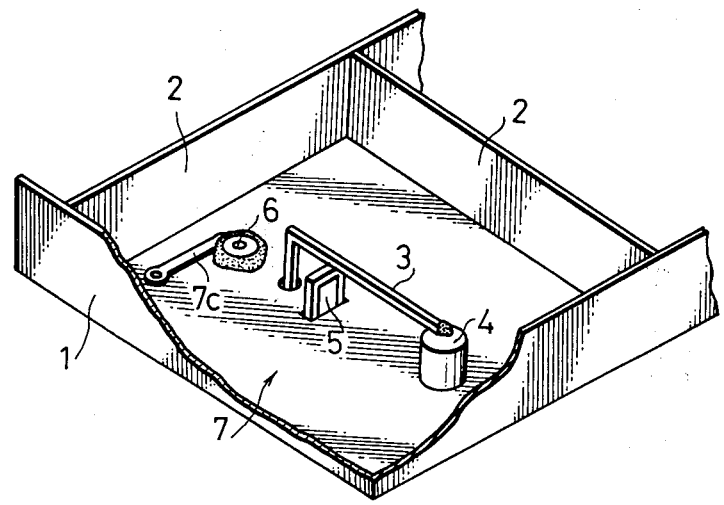
FIG. 1 is a perspective view, partly broken away, showing the construction of a tuning circuit in a prior art tuner.
Figure 2:
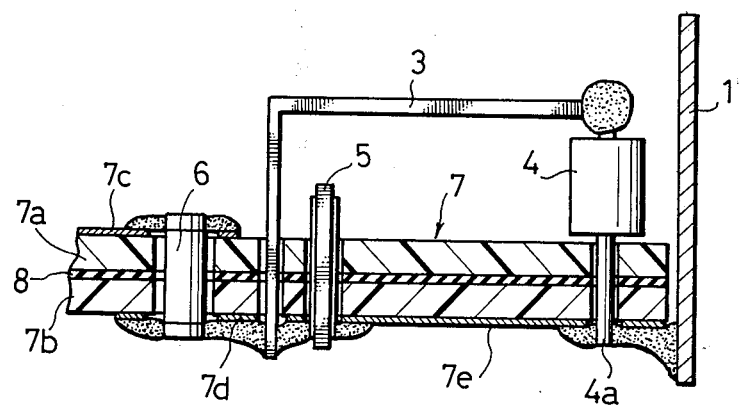
FIG. 2 is a sectional view of the construction of tuning circuit shown in FIG. 1.
Figure 3:
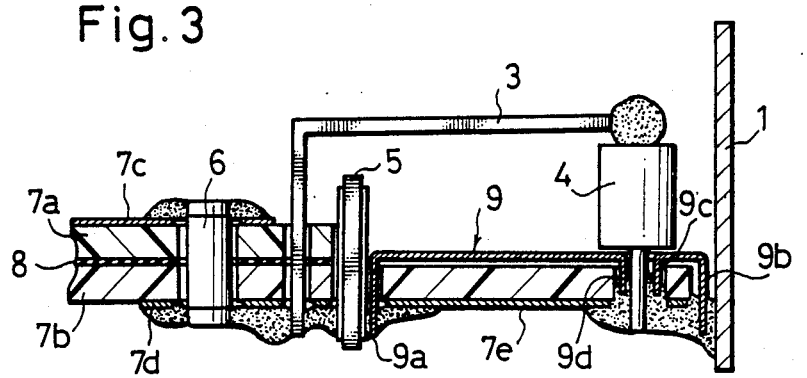
FIG. 3 is a sectional view showing one embodiment of the construction of tuning circuit according to the invention.
Figure 4:
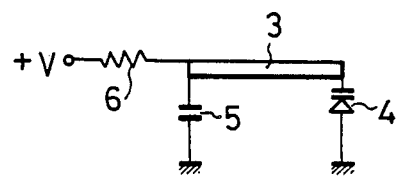
FIG. 4 is a circuit diagram showing the circuit of the tuning circuit construction shown in FIG. 3.

FIG. 3 shows a sectional view of an embodiment of the invention applied to a ½ wavelength resonator. In the Figure, designated at 9 is a metal grounding reinforcement plate. The grounding reinforcement plate 9 is flat at its top and has a plurality of bent connector portions 9a, 9b extending from its edges, one of which is soldered to the chassis. Also, it is formed in its top portion with a hole 9c which is penetrated by the grounding side terminal of varactor diode 4. Its top portion also has downwardly extending flange portions formed around the hole 9c by bending inwardly peripheral areas of the top portion to form inner portions 9d. In this embodiment, like parts as in the prior-art construction are designated by like reference numerals, and their description is omitted. In this embodiment, a portion of the upper printed circuit board 7a corresponding to a tuning circuit extending from end capacitor 5 to varactor diode 4 is removed, and the metal reinforcing plate 9 is provided in that place. FIG. 4 shows the circuit diagram of the tuning circuit of this embodiment.

Figure 5:
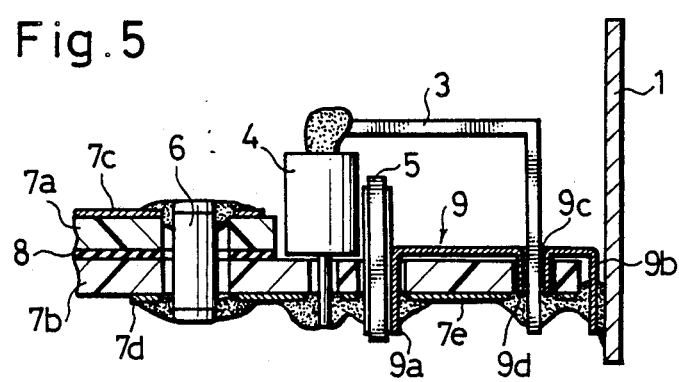
FIG. 5 is a sectional view showing another embodiment of the construction of tuning circuit according to the invention.
Figure 6:
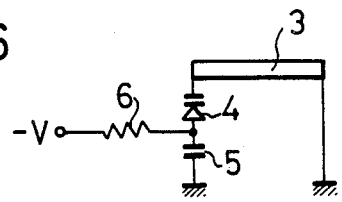
FIG. 6 is a circuit diagram showing the circuit of the tuning circuit construction shown in FIG. 5.

FIG. 5 shows a sectional view of another embodiment of the invention applied to a ¼ wavelength resonator. In this embodiment, like parts as those in the preceding embodiment and prior-art construction are designated by like reference numerals, and their description is omitted. In this embodiment, like the preceding embodiment, a portion of upper printed circuit board 7a corresponding to the tuning circuit is removed, and metal reinforcement plate 9 is provided in its place. FIG. 6 shows the circuit diagram of the tuning circuit of this embodiment.

As has been described in the foregoing, according to the present invention the portion of the upper printed circuit board corresponding to the tuning circuit is removed, and it is thus possible to reduce the thickness of the construction. In addition, the metal grounding reinforcement plate is provided in a portion of the construction where the upper printed circuit board is removed. Consequently, there is no dielectric part located in the vicinity of the tuning circuit which could have adverse effects thereon, so that frequency flucuations with changes of the temperature and relative humidity are extremely reduced compared to the prior-art construction. In addition, the mechanical strength is increased by the grounding reinforcement plate. Further, the residual inductance on the grounding terminal side of the varactor diode is reduced, so that it is possible to increase the frequency coverage of the tuning circuit and hence increase the Q thereof.

What is claimed is:

1. In a construction of a tuning circuit for a tuner having a printed circuit board lamination constituted by an upper printed circuit board and a lower printed circuit board, said upper and lower printed circuit boards being laminated back to back, and electronic component parts being inserted in holes formed in the said printed circuit board lamination, the improvement comprising said printed circuit board lamination being provided with an area lacking said upper printed circuit board, and a varactor diode and a portion of a resonance rod parallel to said printed circuit board lamination being provided in said area with the lead of said varactor diode passing through said lower printed circuit board.

2. A construction of the tuning circuit for a tuner according to claim 1 in which a metal grounding plate is provided such that it overlaps said area.

3. A construction of the tuning circuit for a tuner according to claim 2 in which said grounding plate has a bent edge portion extending at right angles to a top portion thereof and adapted to be soldered to a chassis for the tuning circuit.

4. A construction of the tuning circuit for a tuner according to claim 2 in which said grounding plate is provided with a flange-like portion extending through a hole formed in said lower printed circuit board.

* * * * *